US012593418B2

(12) United States Patent
Wang et al.

(10) Patent No.: US 12,593,418 B2
(45) Date of Patent: Mar. 31, 2026

(54) SERVER

(71) Applicants: SQ TECHNOLOGY(SHANGHAI) CORPORATION, Shanghai (CN); INVENTEC CORPORATION, Taipei City (TW)

(72) Inventors: Wei Wang, Shanghai City (CN); Zhao Geng, Shanghai City (CN); Guang-Zhao Tian, Shanghai City (CN); Hong-Chou Lin, Taipei City (TW); Yu-Fan Chen, Taipei City (TW)

(73) Assignees: SQ TECHNOLOGY(SHANGHAI) CORPORATION, Shanghai (CN); INVENTEC CORPORATION, Taipei City (TW)

( * ) Notice: Subject to any disclaimer, the term of this patent is extended or adjusted under 35 U.S.C. 154(b) by 172 days.

(21) Appl. No.: 18/747,039

(22) Filed: Jun. 18, 2024

(65) Prior Publication Data

US 2025/0380374 A1      Dec. 11, 2025

(30) Foreign Application Priority Data

Jun. 5, 2024    (CN) .......................... 202410727881.0

(51) Int. Cl.
| | |
|---|---|
| *H05K 7/14* | (2006.01) |
| *G06F 1/18* | (2026.01) |
| *G06F 1/185* | (2026.01) |
| *G06F 1/186* | (2026.01) |

(52) U.S. Cl.
CPC ........... *H05K 7/1487* (2013.01); *G06F 1/185* (2013.01); *G06F 1/186* (2013.01); *H05K 7/1489* (2013.01)

(58) Field of Classification Search
CPC ........... H05K 7/1487–1489; G06F 1/185–186
See application file for complete search history.

(56) References Cited

U.S. PATENT DOCUMENTS

| | | | | |
|---|---|---|---|---|
| 2022/0124931 A1* | 4/2022 | Kuang | ................. | H05K 7/1411 |
| 2022/0272861 A1* | 8/2022 | Zhang | ................. | H05K 7/1487 |

* cited by examiner

*Primary Examiner* — Jerry Wu
(74) *Attorney, Agent, or Firm* — Maschoff Brennan

(57) ABSTRACT

A server including a chassis and a multifunction assembly. The chassis has a front side and a rear side that are opposite to each other. The multifunction assembly includes a bracket, a network assembly, an input/output assembly and an expansion assembly. The bracket is disposed on the front side of the chassis. The network assembly, the input/output assembly and the expansion assembly are independently and removably disposed in the bracket.

4 Claims, 10 Drawing Sheets

SERVER

CROSS-REFERENCE TO RELATED APPLICATIONS

This non-provisional application claims priority under 35 U.S.C. § 119(a) on Patent Application No(s). 202410727881.0 filed in China, on Jun. 5, 2024, the entire contents of which are hereby incorporated by reference.

BACKGROUND OF THE INVENTION

Technical Field of the Invention

The invention relates to an electronic device, more particularly to a server.

Description of the Related Art

With the rapid development of the cloud technology, the demand for the server regarding the storage space, the processing speed or the diversity of the function is increased. Thus, in order to meet such demand, the server is required to include various electronic components, such as a network assembly, an input/output assembly and an expansion assembly.

However, in conventional server, the input/output assembly is usually disposed on the motherboard or disposed on the rear side of the server chassis. Thus, the input/output assembly occupies the space around the motherboard or the rear side of the server chassis, thereby reducing the space utilization in the server chassis.

SUMMARY OF THE INVENTION

The invention is to provide a server including a multifunction assembly integrating a network assembly, an input/output assembly and an expansion assembly therein to improve the space utilization in the chassis.

One embodiment of this invention provides a server including a chassis and a multifunction assembly. The chassis has a front side and a rear side that are opposite to each other. The multifunction assembly includes a bracket, a network assembly, an input/output assembly and an expansion assembly. The bracket is disposed on the front side of the chassis. The network assembly, the input/output assembly and the expansion assembly are independently and removably disposed in the bracket.

According to the server disclosed by above embodiments, the network assembly, the input/output assembly and the expansion assembly are individually and removably disposed in the bracket. That is, the network assembly, the input/output assembly and the expansion assembly are integrated into the bracket disposed on the front side. Accordingly, the input/output assembly is prevented from occupying the space around the motherboard or the rear side of the chassis, thereby improving the space utilization in the chassis.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

Figure 1:
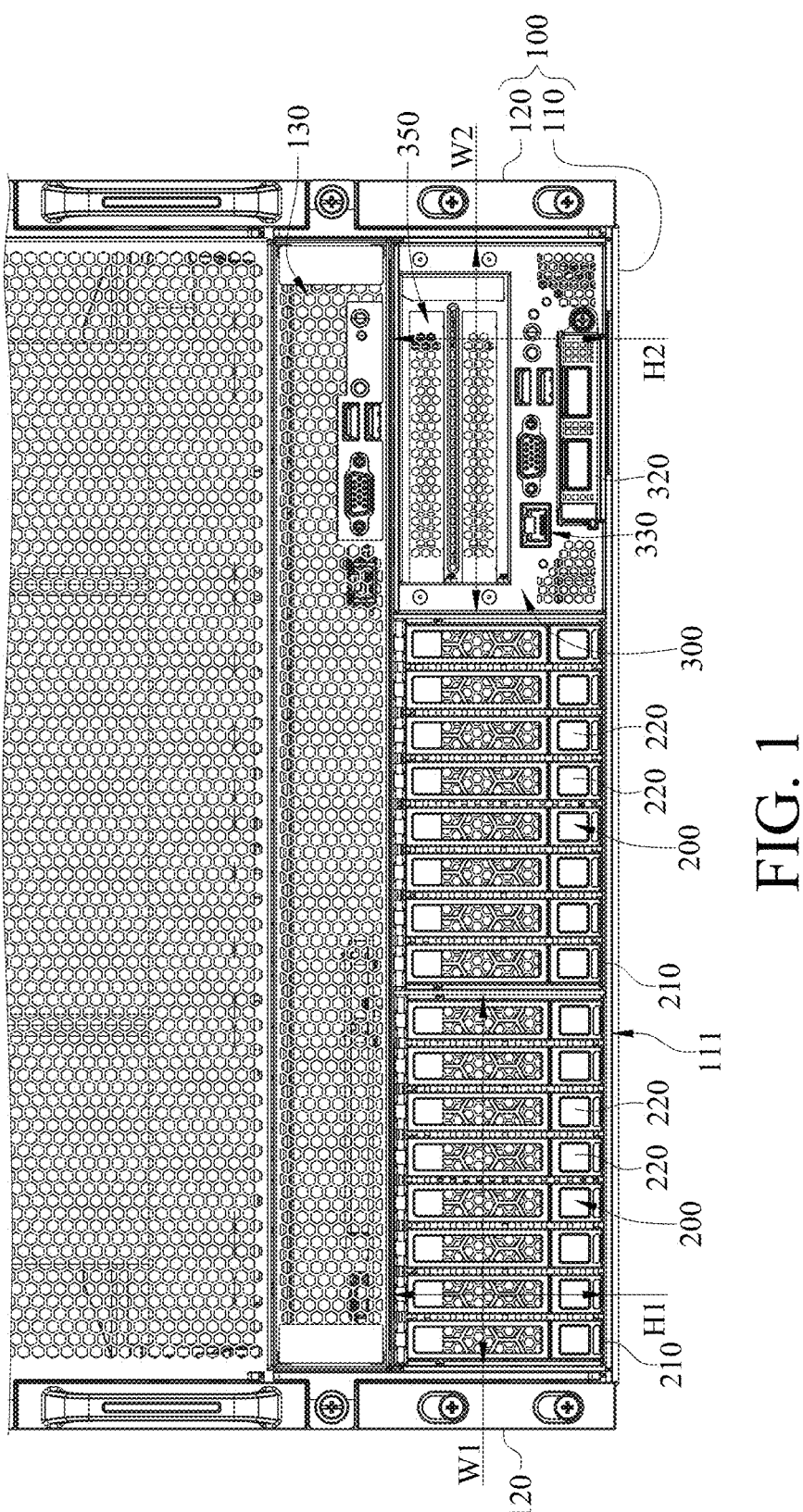
FIG. 1 is a front view of a server according to one embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Please refer to FIG. 1 that is a front view of a server 10 according to one embodiment of the invention. In this embodiment, the server 10 includes a chassis 100, two disk drive assemblies 200 and a multifunction assembly 300.

The chassis 100 includes a bottom plate 110 and two side plates 120. The two side plates 120 are connected to two opposite sides of the bottom plate 110, respectively. The bottom plate 110 has a front side 111 and a rear side that are opposite to each other. The front side 111 is located adjacent to, for example, an opening of a cabinet (not shown) for accommodating the server 10. Note that in order to clearly show the technical contents of this invention, the rear side is omitted in the drawings. In addition, the server 10 has a height of, for example, 8U. Also, in order to clearly show the technical contents of this invention, only a part of the server 10 is shown in FIGS. 1 and 2.

The two disk drive assemblies 200 are disposed on the front side 111. For example, the two disk drive assemblies 200 each include a disk drive cage 210 and eight disk drives 220 disposed in the disk drive cage 210.

Figure 2:
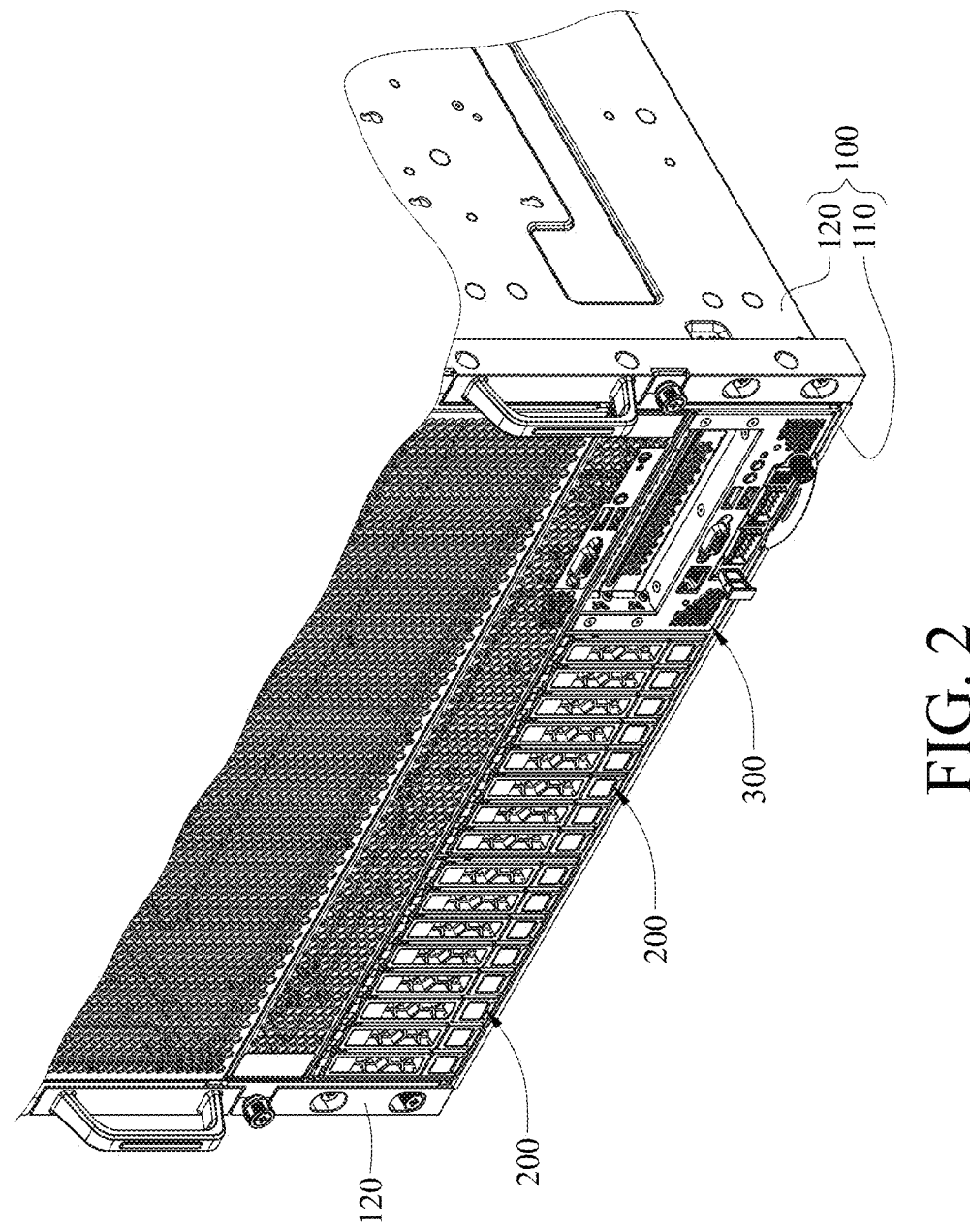
FIG. 2 is a perspective view of a multifunction assembly of the server in FIG. 1.
Figure 3:
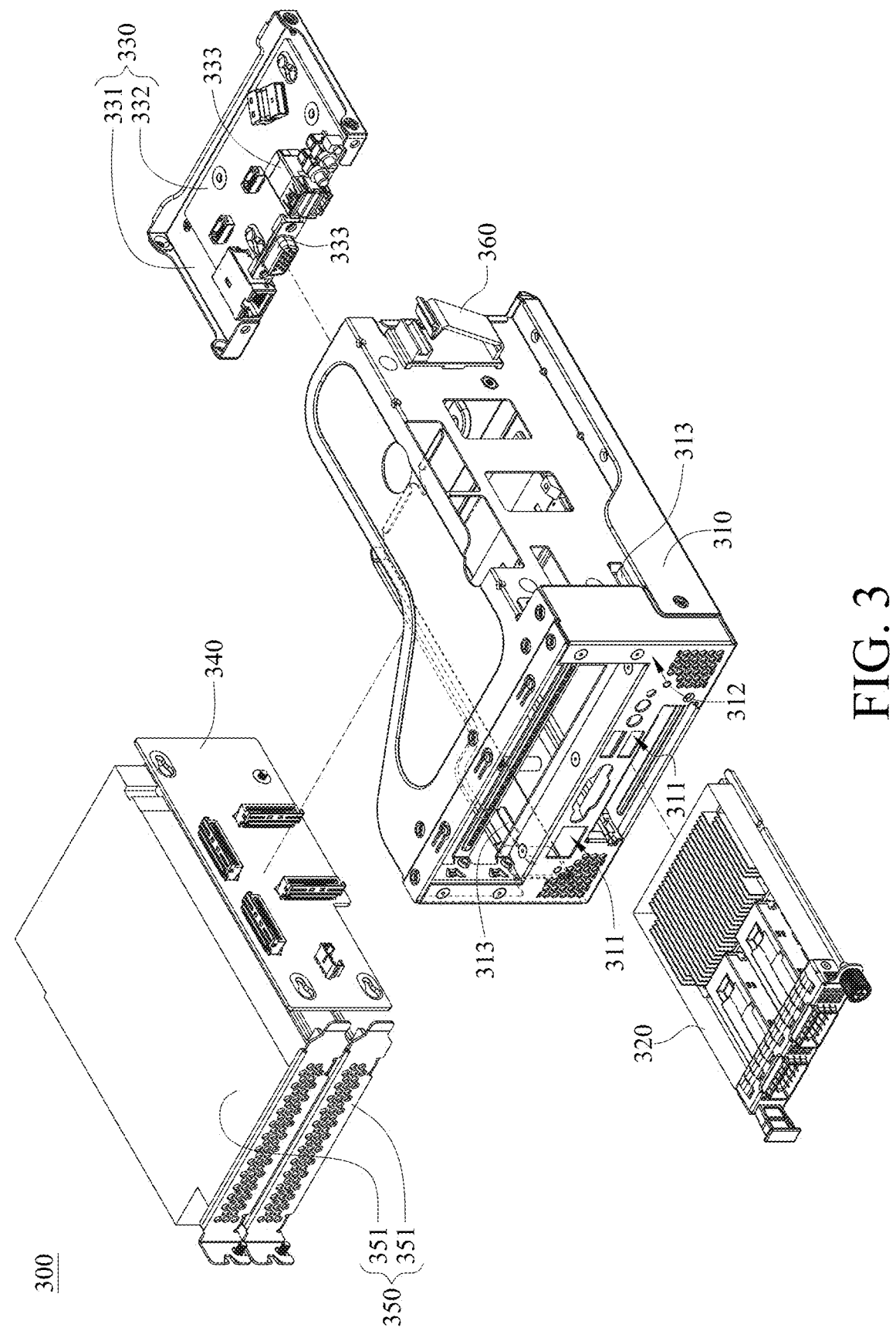
FIG. 3 is an exploded perspective view of the multifunction assembly in FIG. 2.

Please refer to FIGS. 1 to 3. FIG. 2 is a perspective view of the multifunction assembly 300 of the server 10 in FIG. 1. FIG. 3 is an exploded perspective view of the multifunction assembly 300 in FIG. 2.

In this embodiment, the multifunction assembly 300 includes a bracket 310, a network assembly 320, an input/output assembly 330, a riser card 340, an expansion assembly 350 and a cable management component 360.

The bracket 310 is disposed on the front side 111 of the bottom plate 110, and have a plurality of openings 311. The openings 311 are located on a front side 312 of the bracket 310. The network assembly 320, the input/output assembly 330 and the expansion assembly 350 are independently and removably disposed in the bracket 310. In detail, the network assembly 320 is removably inserted in the bracket 310, and meets the specification of, for example, Open Compute Project (OCP). The input/output assembly 330 includes a tray 331 and a circuit board assembly 332. The circuit board assembly 332 has a plurality of ports 333 and is disposed on the tray 331. The tray 331 is slidably disposed in the bracket 310 by two protruding plates 313 of the bracket 310. The riser card 340 is removably mounted to the bracket 310 via, for example, screwing. The expansion assembly 350 includes, for example, two expansion cards 351. The expansion cards 351 are electrically connected to the riser card 340, and are removably mounted to the bracket 310 via, for example, screwing. The cable management component 360 is disposed on an outer side of the bracket 310.

Note that the expansion assembly 350 is not limited to including two expansion cards 351. In other embodiments, the expansion assembly may include two disk drives, or may include one expansion card and one disk drive.

In addition, in this embodiment, the network assembly 320, the input/output assembly 330 and the expansion assembly 350 are spaced apart from the bottom plate 110 by different distances, respectively. For example, the expansion assembly 350 is located farther away from the bottom plate 110 than the input/output assembly 330 and the network assembly 320, and the input/output assembly 330 is located between the network assembly 320 and the expansion assembly 350. By at least one of the said arrangement, the space utilization of the limited space in the bracket 310 is improved.

In addition, in this embodiment, at least one of the network assembly 320, the input/output assembly 330 and the expansion assembly 350 has the ports 333 exposed to the outside from the openings 311. In this embodiment, for example, it is the input/output assembly 330 that has the ports 333 exposed to the outside from the openings 311.

Furthermore, in this embodiment, an overall size of each disk drive assembly 200 is, for example, equal to an overall size of the multifunction assembly 300. Further, in the front view shown in FIG. 1, a width W1 and a height H1 of each disk drive assembly 200 are identical to a width W2 and a height H2 of the multifunction assembly 300, respectively. That is, the two disk drive assemblies 200, the multifunction assembly 300 and the one or more dummies used when the disk drive assemblies 200 and the multifunction assembly 300 are removed may exchange their position or may be replaced by one another, thereby improving the flexibility in arrangement. In addition, the height H1 of each disk drive assembly 200 and the height H2 of the multifunction assembly 300 are, for example, 2U.

Moreover, in this embodiment, the chassis 100 has, for example, a heat dissipation space 130. The disk drive assembly 200 and the multifunction assembly 300 are located between the heat dissipation space 130 and the bottom plate 110.

Please refer to FIGS. 4 to 10 that show an assembling process of the multifunction assembly 300 in FIG. 2.

Figure 4:
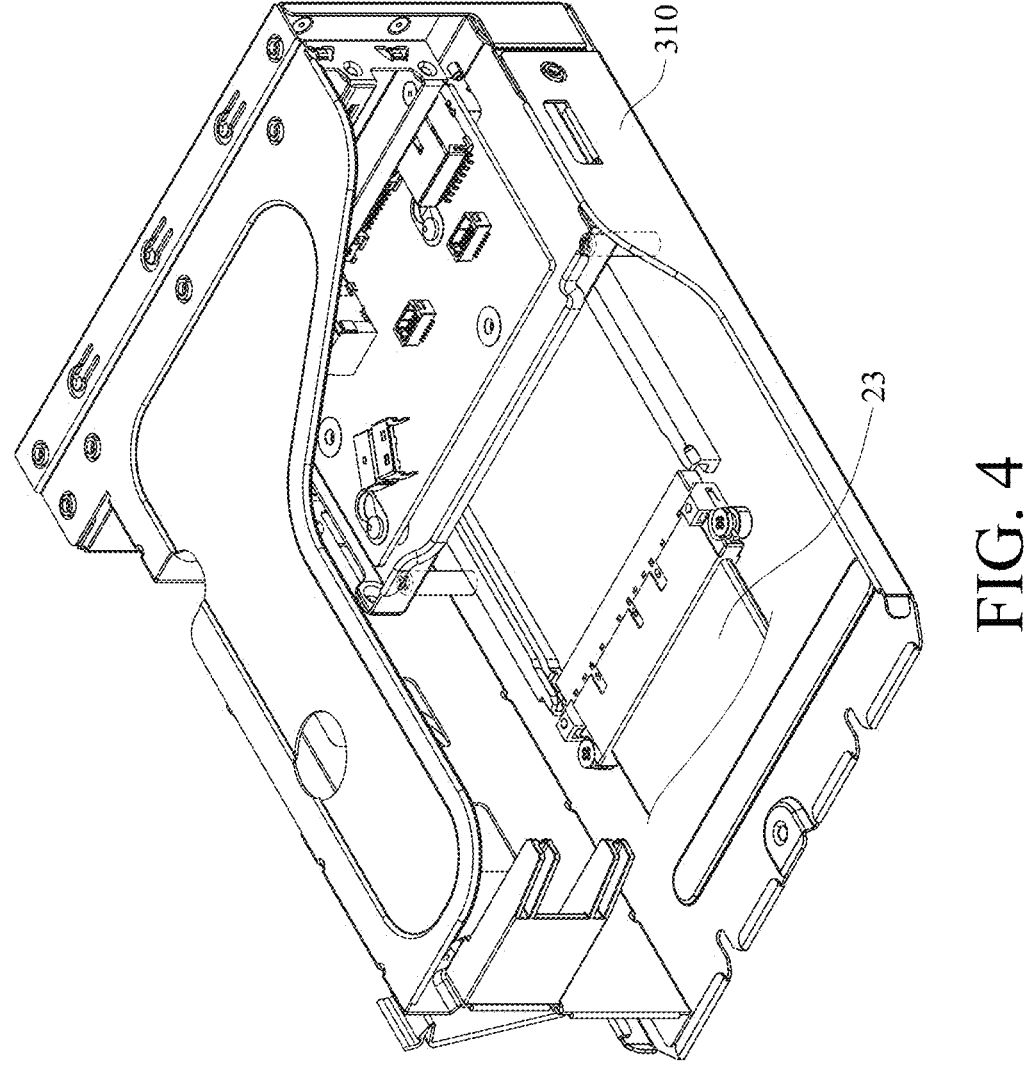
FIGS. 4 to 10 show an assembling process of the multifunction assembly in FIG. 2.

As shown in FIG. 4, a cable 23 for being electrically connected to the network assembly 320 in FIG. 3 is fixed via screwing.

Figure 5:
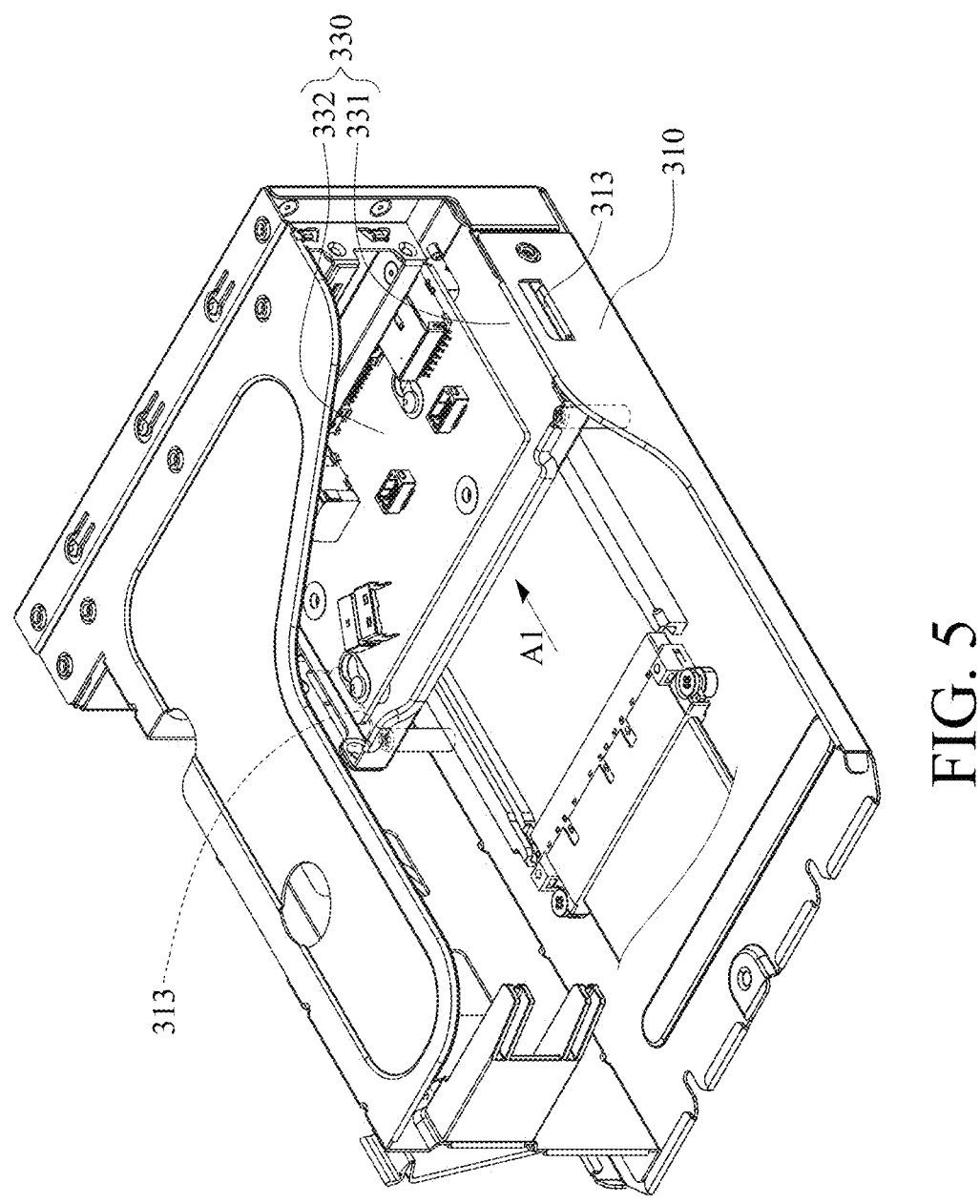

As shown in FIG. 5, the tray 331 is slidably disposed in the bracket 310 via the two protruding plates 313 along a mounting direction A1, and then the tray 331 is removably mounted to the bracket 310 via screwing.

Figure 6:
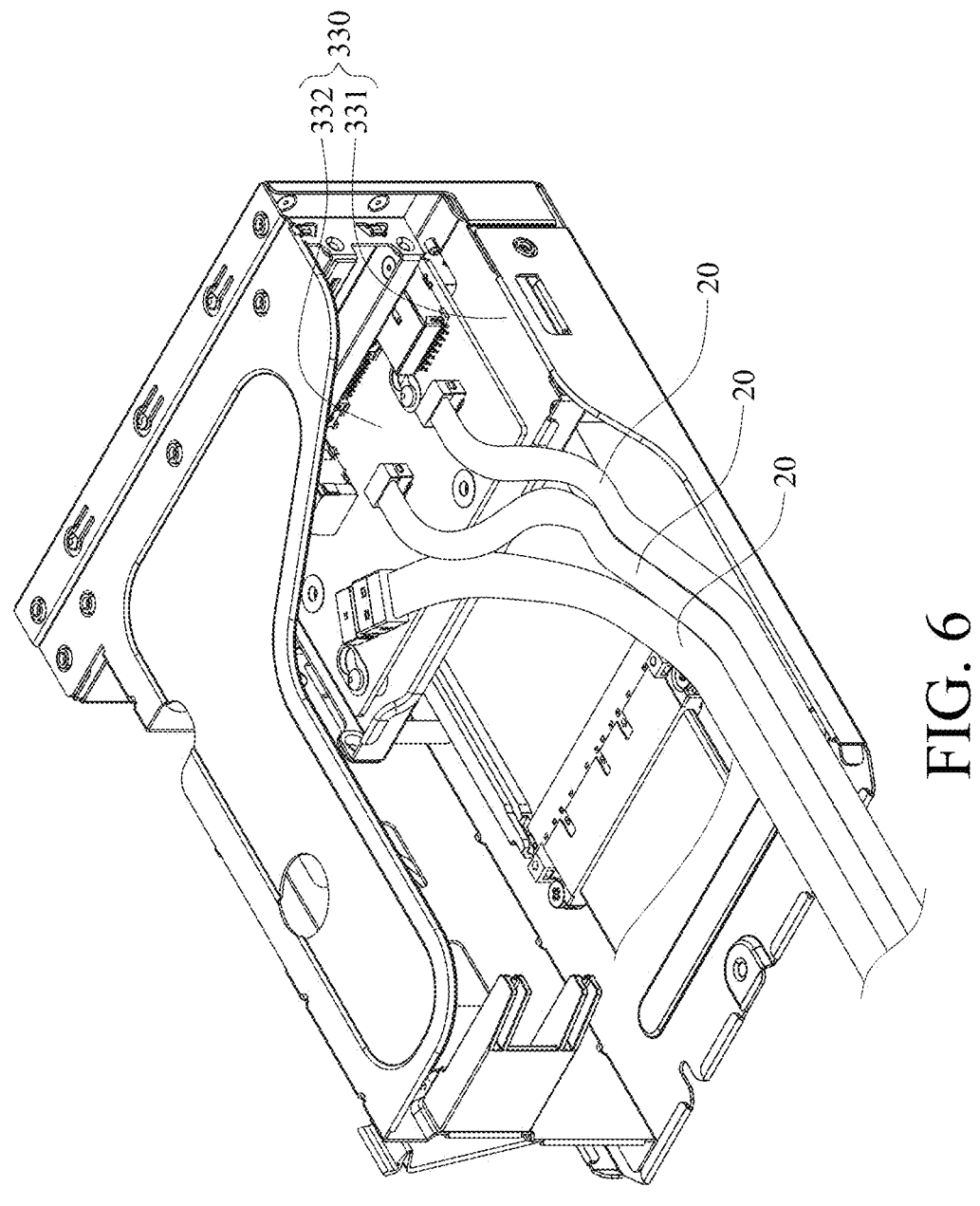

As shown in FIG. 6, a plurality of cables 20 are electrically connected to the circuit board assembly 332.

Figure 7:
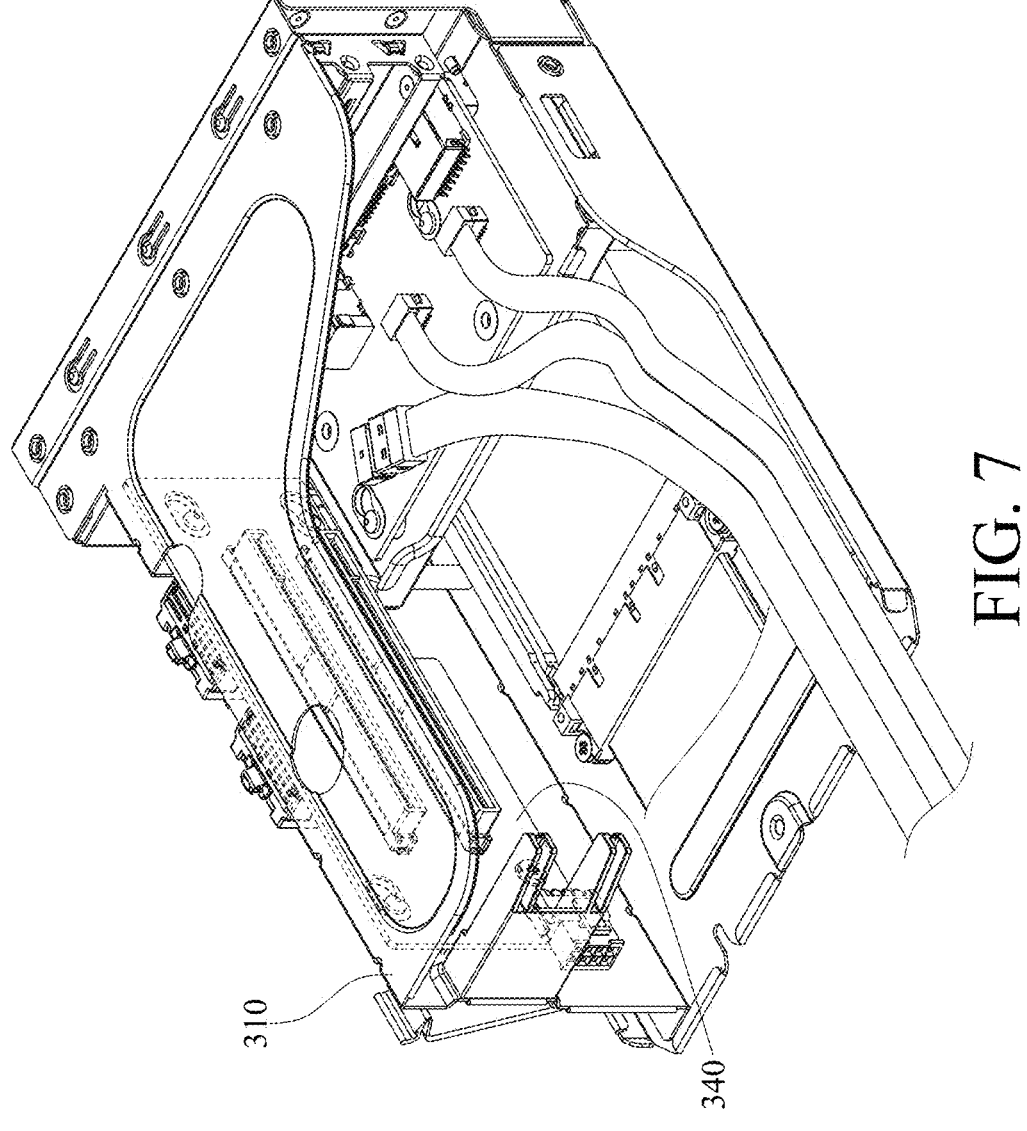

As shown in FIG. 7, the riser card 340 is removably mounted in the bracket 310 via screwing.

Figure 8:
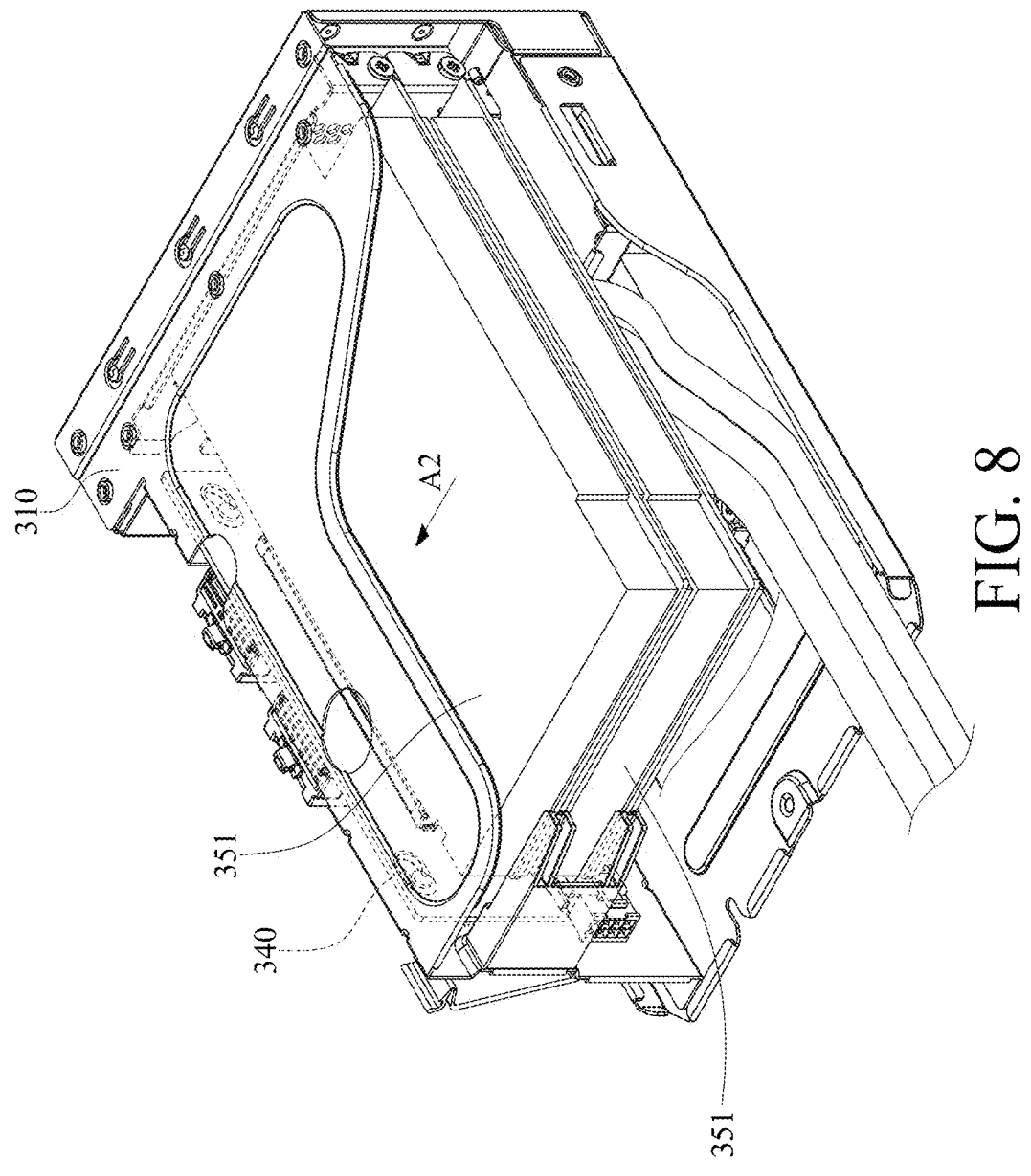

As shown in FIG. 8, the expansion cards 351 are plugged and electrically connected to the riser card 340 along a mounting direction A2, and the expansion cards 351 are removably mounted in the bracket 310 via screwing.

Figure 9:
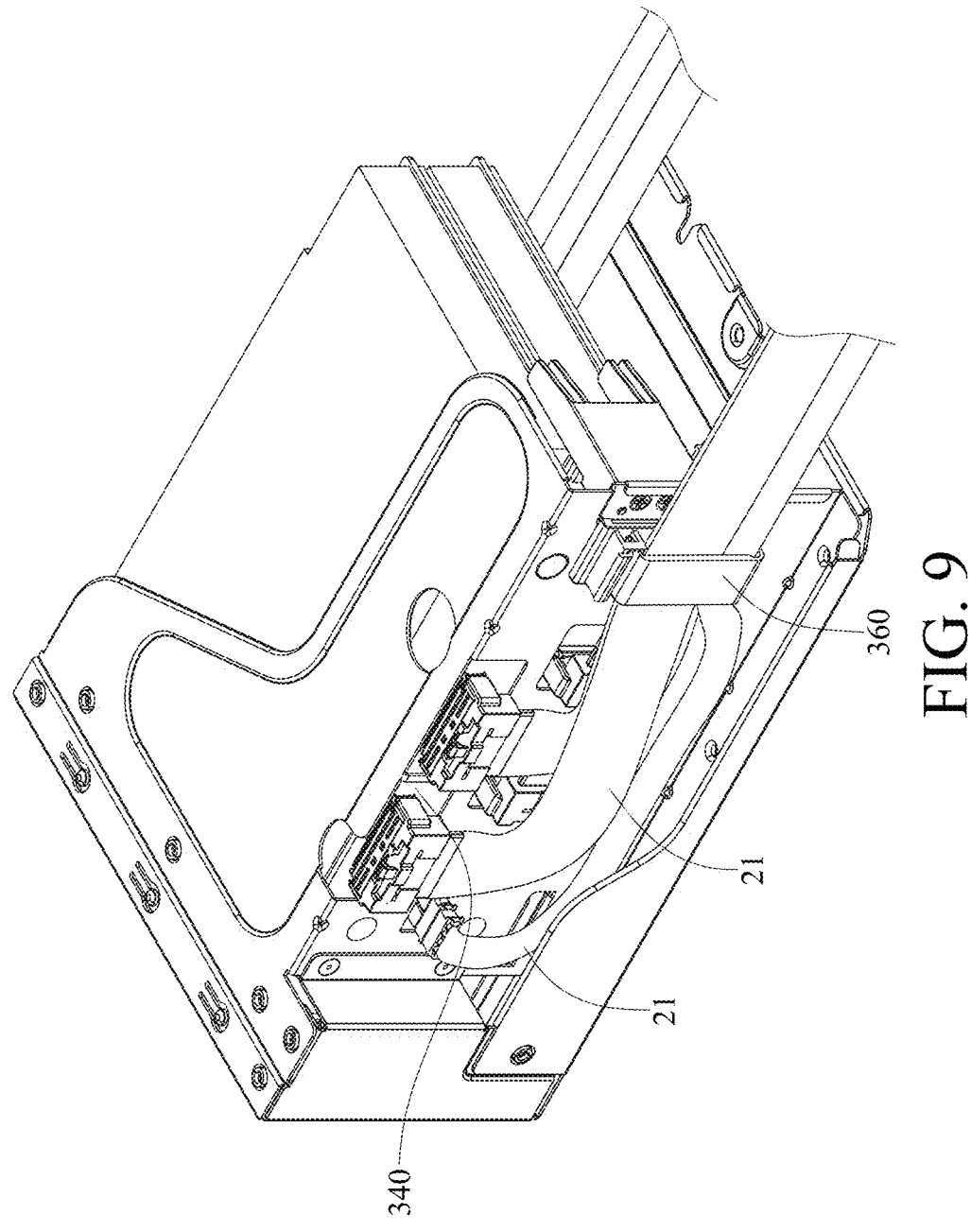

As shown in FIG. 9, a plurality of cables 21 are electrically connected to the riser card 340, and the cables 21 are managed by the cable management component 360.

Figure 10:
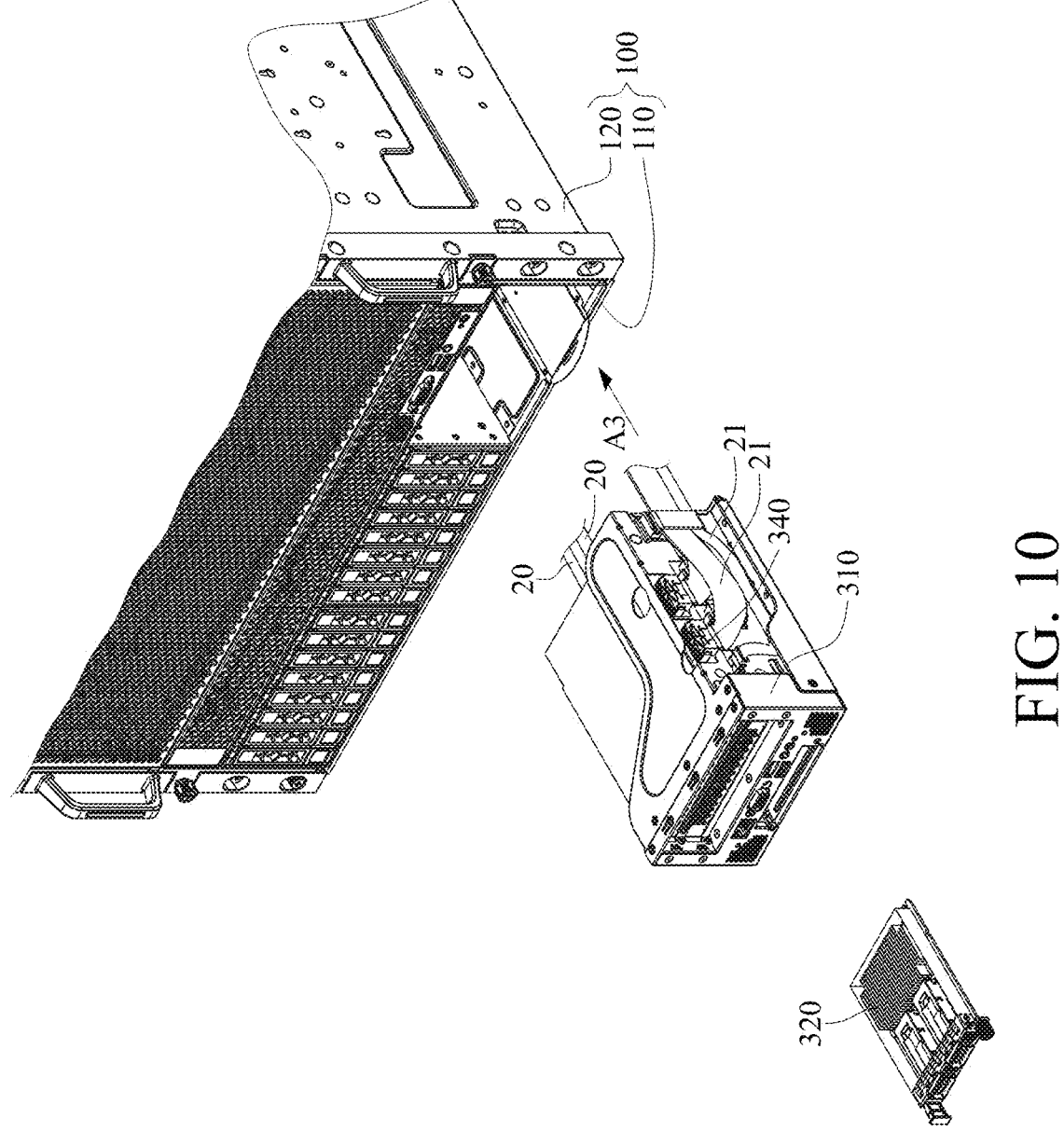

As shown in FIGS. 3, 4 and 10, the bracket 310 is inserted into the chassis 100 along a mounting direction A3, and the bracket 310 is removably mounted in the chassis 100 via screwing. Then, the network assembly 320 is inserted into the bracket 310 along the mounting direction A3, and the network assembly 320 and the cable 23 are electrically connected. Then, the cable 23 electrically connected to the network assembly 320, the cables 20 electrically connected to the circuit board assembly 332 of the input/output assembly 330, and the cable 21 electrically connected to the riser card 340 are electrically connected to a motherboard (not shown) disposed in the chassis 100.

According to the server disclosed by above embodiments, the network assembly, the input/output assembly and the expansion assembly are individually and removably disposed in the bracket. That is, the network assembly, the input/output assembly and the expansion assembly are integrated into the bracket disposed on the front side. Accordingly, the input/output assembly is prevented from occupying the space around the motherboard or the rear side of the chassis, thereby improving the space utilization in the chassis.

Further, there are two disk drive assemblies and one input/output assembly disposed on the front side of the chassis, which allows a user to selectively use at least one of the disk drive assemblies and the input/output assembly, thereby meeting different actual requirements.

In addition, the expansion assembly is changed to be disposed on the front side. Thus, there is no cable on the rear side of the cabinet for accommodating the server, thereby facilitating the design of the airtight channel in the server room and allowing the expansion assembly to operate in a channel where a cold air passes. Also, the maintenance of the server is facilitated since the assembly or the removal of the expansion assembly is allowed to be performed on the front side. In this way, the reliability of the server is ensured while improving the compatibility, the flexibility in arrangement and the maintenance efficiency of the server. Additionally, the server is allowed to be eco-friendly.

Furthermore, the network assembly and the expansion assembly may be electrically connected to the motherboard by one or more cables with high transmission rate, and thus the flexibility in arrangement and the reliability of the server is improved.

Moreover, the invention can be applied to a server having a height of 2U or higher height, and can be used in different applications to have better compatibility.

It will be apparent to those skilled in the art that various modifications and variations can be made to the present invention. It is intended that the specification and examples be considered as exemplary embodiments only, with a scope of the invention being indicated by the following claims and their equivalents.

What is claimed is:

1. A server, comprising: a chassis, having a front side plate and a rear side plate that are opposite to each other; and a multifunction assembly, comprising a bracket, a network assembly, an input/output assembly and an expansion assembly with two expansion cards inserted to a riser card, wherein the bracket is disposed on the front side wall of the chassis, and the network assembly, the input/output assembly and the expansion assembly are independently and removably disposed in the bracket; and the chassis comprises a bottom plate and two side plates, the two side plates are connected to two opposite sides of the bottom plate, respectively, the front side plate and the rear side plate of the chassis are located on the bottom plate, and the expansion assembly is located farther away from the bottom plate than the input/output assembly which is sandwiched between the expansion assembly and the network assembly; and the bracket has at least one opening located on a front side of the bracket, each of the network assembly and the input/output assembly has at least one port exposed from the at least one opening and the front side plate; and two disk drive assemblies are disposed on the front side plate of the chassis, and an overall size of each of the two disk drive assemblies is equal to an overall size of the multifunction assembly.

2. The server according to claim 1, wherein the input/ output assembly comprises a tray and a circuit board assembly, the circuit board assembly has at least one port and is disposed on the tray, and the tray is slidably disposed in the bracket.

3. The server according to claim 1, wherein:

the input/output assembly is removably mounted in the bracket;

the expansion assembly is removably mounted in the bracket;

the bracket is removably mounted to the front side of the chassis; and the network assembly is removably mounted in the bracket.

4. The server according to claim 3, wherein before removably mounting the expansion assembly in the bracket, a riser card is removably mounted in the bracket.

* * * * *